United States Patent [19]

Ford

[11] 4,059,069

[45] Nov. 22, 1977

[54] COATING APPARATUS

[75] Inventor: Donald T. Ford, Mountain View, Calif.

[73] Assignee: The Arnold Engineering Company, Marengo, Ill.

[21] Appl. No.: 718,738

[22] Filed: Aug. 30, 1976

[51] Int. Cl.² .............................................. B05C 1/00
[52] U.S. Cl. .................................... 118/642; 118/206; 118/212; 118/423; 427/259; 427/264
[58] Field of Search ............... 118/212, 249, 211, 252, 118/234, 246, 235; 427/259, 265; 101/DIG. 10, 228, 154; 354/339, 319, 320, 321, 318

[56] References Cited

U.S. PATENT DOCUMENTS

| 1,672,842 | 6/1928 | Wagner et al. | 118/212 X |
| 1,987,062 | 1/1935 | Hickman | 354/339 X |
| 2,086,191 | 7/1937 | Rutkoskie | 118/212 X |
| 2,774,327 | 12/1956 | Saint-Hilaire | 427/130 X |
| 3,102,472 | 9/1963 | Kieckhefer, Jr. | 101/228 |

OTHER PUBLICATIONS

Western Electric Technical Digest "A Self-Correcting System for Maintaining Alignment of Webs Between Vacuum Drums" Hetherington, No. 31 [July, 1973] pp. 27, 28.

Primary Examiner—Morris Kaplan
Attorney, Agent, or Firm—Vincent G. Gioia; Robert F. Dropkin

[57] ABSTRACT

Aluminum or other coating material is deposited on the surface of one side of a strip after which ink is deposited on preselected areas of the coated strip. The ink is then cured and the aluminum removed from the uncovered areas after which the ink is removed from the covered area of the aluminum.

1 Claim, 10 Drawing Figures

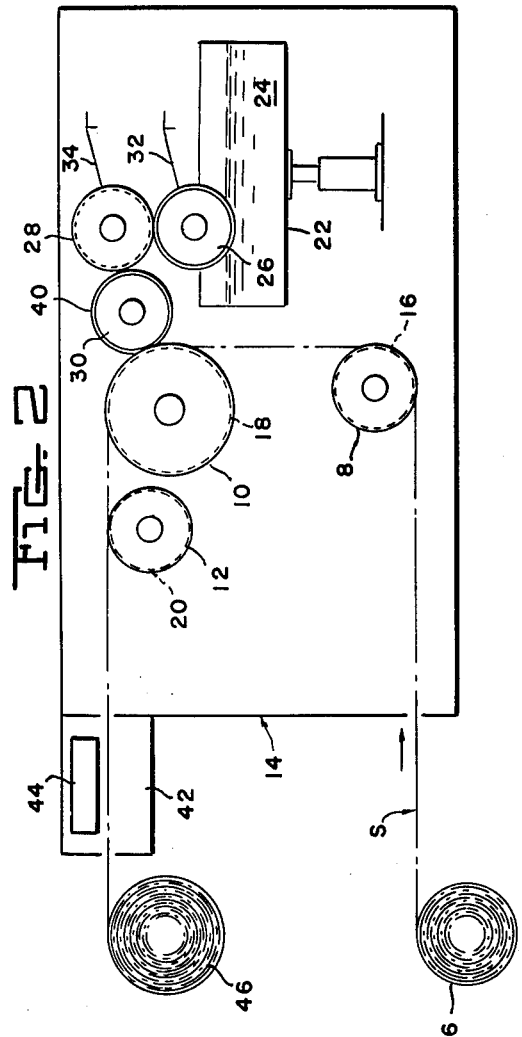
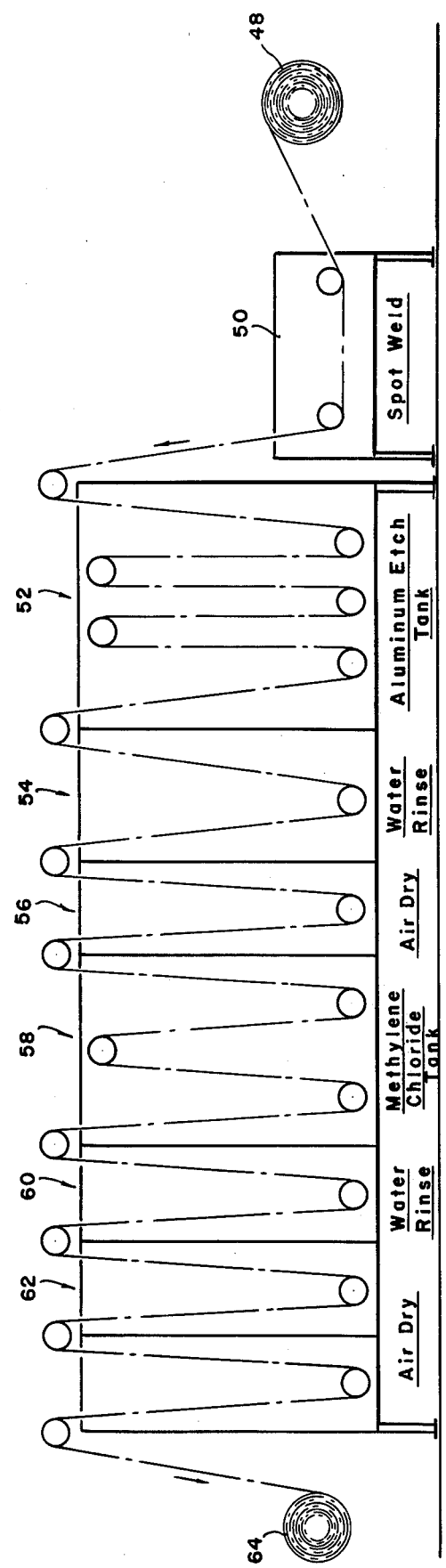

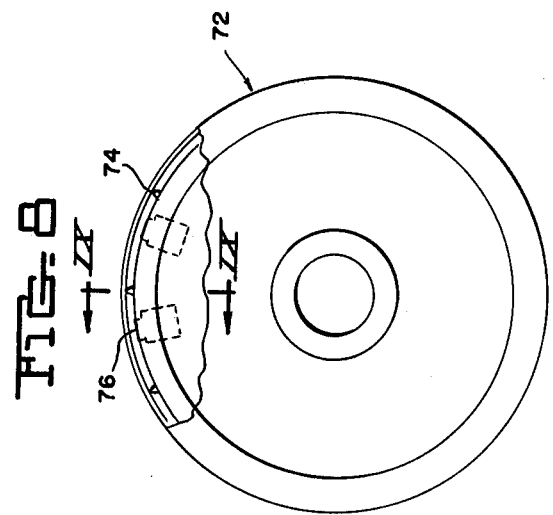
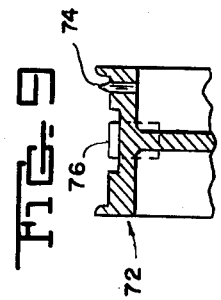
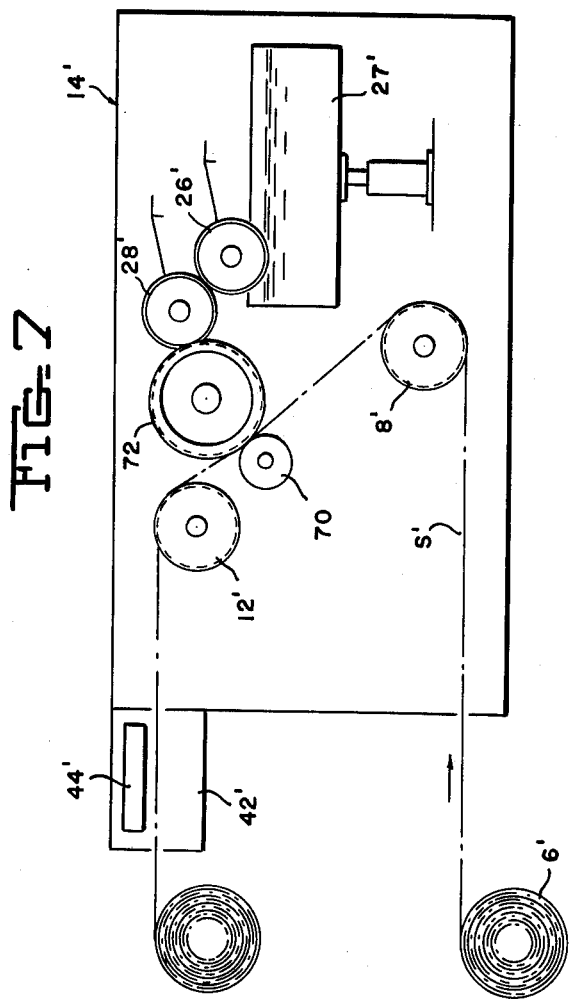
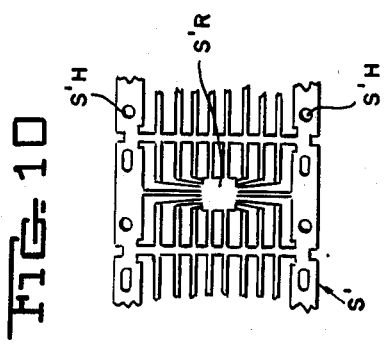

COATING APPARATUS

This invention relates to an apparatus for depositing a coating material on preselected areas of a substrate and more particularly for depositing aluminum on lead frame strips for the electronic industry. The two most common methods of doing this are by masking all the strip except the portion on which aluminum is desired by means of masking wheels as disclosed in Krumme et al U.S. Pat. No. 3,735,728 dated May 29, 1973; and by depositing aluminum over the entire surface of the strip, then masking with tape the surface on which aluminum is desired, after which the aluminum is removed from the unmasked areas. The tape is then removed. Both of these methods have the drawbacks that the size and location of the stripe or other aluminum covered area are dependent upon mechanical tolerances in machine set up and do not lend themselves to fast rates of production. Processing and tooling costs are high. In U.S. Pat. No. 3,735,728 the entire process must be carried out in a vacuum so that both mask and parts must be indexed in the vacuum. Long start-up and shut-down times are required.

St. Clair et al U.S. Pat. No. 3,537,175 dated Nov. 3, 1970 discloses a method and apparatus which is the best art of which I have knowledge. In this patent the strip is coated with aluminum in a vacuum deposition chamber and the material is then stamped into lead frames. To obtain the desired aluminum configuration on the stamped parts they are selectively etched to leave the desired pattern. The selective spot is put on by passing the strip of stamped parts between a masked strip and a rotating wheel. A plastic material is sprayed on to the exposed portions of the stamped strip and then dried. Then the strip is run through a caustic soda solution to etch the uncovered aluminum after which the plastic is removed by acetone solutions. This arrangement has several disadvantages. It is necessary to use a sprayed mask for selectively coating the stamped parts with the plastic resist. Also, the plastic spray accumulates on the mask as well as on the drum over which the mask and strip pass. The amount of heat required to speed up the drying is so high as to cause many problems. The plastic spray contains a large amount of moisture and since it is slow drying the speed of the line is low.

I have found that by using ink and applying it be means of rolls, not only is maintenance less, but a more accurate ink design is applied at a much greater speed.

It is therefore an object of my invention to provide an apparatus for depositing a coating material on preselected areas of a substrate which is less expensive and faster than in prior systems.

Another object is to provide such an apparatus which does not require a separate mask and/or a slow drying plastic spray or the use of a tape system.

Still another object is to provide apparatus for depositing a coating material on preselected areas of a substrate which is less expensive than those of the prior art.

A further object is to provide such apparatus in which the parts following the initial coating are located out of a vacuum.

A still further object is to provide such apparatus which can operate faster than those of the prior art.

These and other objects will be more apparent after referring to the following specification and attached drawings in which;

FIG. 1 is a schematic view of an aluminum vapor deposition line used in my invention;

FIG. 2 is a schematic view of the ink deposition line of my invention;

FIG. 3 is a schematic view of a line for selectively removing aluminum and ink according to my invention;

FIG. 4 is an elevation of a rotogravure wheel used with my invention;

FIG. 5 is a sectional view of the striping roll of FIG. 2;

FIG. 6 is a plan view of the workpiece coated on the apparatus of FIGS. 1 to 5;

FIG. 7 is a schematic view of a modified ink deposition line;

FIG. 8 is an elevation of the dotting roll of FIG. 7;

FIG. 9 is a view taken on line IX—IX of FIG. 8; and

FIG. 10 is a plan view of the workpiece coated on the apparatus of FIGS. 7 to 9.

Referring more particularly to FIG. 1 of the drawings reference numeral 2 indicates a reel strip S is unreeled and fed through a conventional aluminum vapor deposition line 3 such as shown in the St. Clair et al patent. Here one side of the strip S is coated with aluminum and the coated strip is coiled onto reel 4. The reel of coated strip S is then fed from a reel 6 (FIG. 2) around rolls 8, 10 and 12 supported in framework 14. The rolls 8, 10 and 12 have flat bottomed grooves 16, 18 and 20 of just sufficient width for receiving the strip S. The groove 18 in control guide roll 10 is very accurately machined so that the strip S is precisely positioned. Also positioned in frame work 14 is a reservoir 22 for receiving ink 24. The reservoir is movable vertically in order to enable ready replacement and removal of an inking wheel 26 which is a plain rotatable rubber covered roll. A rotogravure wheel 28 bears against wheel 26 and also against a striping roll 30 which in turn bears against roll 10. Wiper blades 32 and 34 are provided for wheels 26 and 28, respectively. The wheel 28 has spaced apart small cavities 36 in its outer surface and roll 30 has a rubber outer rim 38 having a peripheral projection 40. From roll 12 the strip passes through a box 42 having an ultraviolet light 44 therein after which it is coiled on a reel 46. The strip then passes from a reel 48 (FIG. 3) successively through a spot weld station 50, an aluminum etch tank 52, a water rinse tank 54, an air drying compartment 56, a methylene chloride tank 58, a water rinse tank 60, and air drying station 62 to a reel 64.

The operation of my device is as follows when the strip S is made of a low expansion alloy on which an aluminum stripe SS is to be applied with the strip being used for integrated circuit lead frames. Ink 24 is placed in reservoir 22 with wheel 26 in contact therewith. A suitable ink is SR-12 manufactured by Dyna-Chem Corporation, which is over 90% solids, but this vary depending upon the substrate and coating materials. Aluminum is applied to strip S in the vapor deposition line 3 and coated strip from reel 6 is then passed through the ink applicator line to reel 46. The rotating inking wheel 26 picks up ink from the reservoir 22 and feeds it to rotating wheel 28 where it is received in the cavities 36. The wipers 32 and 34 remove excess ink from the wheels 26 and 28. Ink from wheel 28 is fed onto peripheral projection 40 of roll 30 which in turn places a stripe SS of the desired width on the strip S. The ink on the strip is then dried or cured as it passes under ultraviolet light 44 after which it is coiled on reel 46. The strip is then fed from reel 48 to tank 52 where the uncovered aluminum is removed by sodium hydroxide or other suitable agent. The strip is then rinsed and air dried before passing into the methylene chloride tank 58 where the ink is removed. The strip is then dried and coiled on reel 64 where it is ready for use. When one reel is exhausted the leading end of strip on a second reel is welded to the end of the strip of the first reel at station 50. While the aluminum coating line, ink applying line and the removal line could be interconnected, I prefer not to do this since the most efficient speeds of the lines are different. Ink one ink applying line the speed is 260 ft. per min. and a faster line is being designed. This compares to a maximum speed of about 30 ft. per min. for a line such as shown in the St. Clair et al patent. This difference is due to the time required to apply and cure the plastic material.

Other coatings may be applied to other substrates and the design of the coating may be varied in some cases by merely changing the configuration of wheel 10. In other cases the strip must be indexed. FIG. 7 shows a modified ink applicator line for this purpose when coating resist spots S'R on a stamped lead frame strip S'. It will be seen that this strip (FIG. 10) has spaced holes S'H along each side. In this embodiment the aluminum coated strip S' passes around guide roll 8' to guide roll 12'. Between the guide rolls a rubber cover pressure roll 70 deflects the strip S' into contact with a dotting roll 72. The dotting roll 72 has pins 74 spaced around its periphery with the size and spacing of the pins such that will engage holes S'H. the dotting roll also includes rubber projections 76 of such size and spacing that will apply ink on strip S' at spots S'R. In this embodiment the striping roll 30 is omitted and the ink is applied from wheel 28' directly to wheel 72. No separate line is required for this purpose. If strips S and S' are the same width the rolls 8', 12' and wheels 26' and 28' will be rolls 8 and 12 and wheels 26 and 28 of the first embodiment with roll 30 being removed and wheel 28 being positioned to bear against roll 72 which replaces roll 10. Roll 70 will obviously be inoperative when the line is used as in the first embodiment. For different width strips, rolls of difference widths will be used. The coating and coat removal lines will be as in the first embodiment.

While two embodiments have been shown and described, it will be readily apparent to those skilled in the art that various adaptations and modifications may be made within the scope of the invention.

I claim:

1. Apparatus for depositing a coating material on preselected areas of an elongated strip which in a continuous system comprises coating material depositing means, means for passing said strip through said coating material depositing means to deposit coating material on the surface of one side of said strip, ink depositing means, means for passing said strip with said coating thereon through said ink depositing means to deposit ink only on said preselected areas, ink curing means, means for passing said strip with ink deposited thereon through said ink curing means to cure said deposited ink, strip etching means, means for passing said strip with said cured ink thereon through said strip etching means to remove coating material from that portion of the strip not covered by said cured ink, ink removing means, and means for passing said strip from said strip etching means through said ink removing means to remove the ink therefrom, said ink depositing means including a reservoir having said ink therein, an inking wheel above and extending downwardly into said ink and a rotagravure wheel having its periphery in contact with said inking wheel and with an applicator roll and said applicator roll having a peripheral groove of slightly larger width than said strip, indexing projections adapted to operatively associate with indexing holes in said strip and coating projections corresponding to said preselected areas on said strip.

* * * * *